United States Patent
Lin

(10) Patent No.: US 11,378,611 B1
(45) Date of Patent: Jul. 5, 2022

(54) MEASUREMENT METHOD FOR CONTACT RESISTANCE OF TRANSISTOR TEST DEVICE AND COMPUTER-READABLE MEDIUM

(71) Applicant: CHANGXIN MEMORY TECHNOLOGIES, INC., Hefei (CN)

(72) Inventor: Shih-Chieh Lin, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 0 days.

(21) Appl. No.: 17/602,846

(22) PCT Filed: Jul. 15, 2021

(86) PCT No.: PCT/CN2021/106550
§ 371 (c)(1),
(2) Date: Oct. 11, 2021

(87) PCT Pub. No.: WO2022/077980
PCT Pub. Date: Apr. 21, 2022

(30) Foreign Application Priority Data

Oct. 16, 2020 (CN) .......................... 202011108324.9

(51) Int. Cl.
*G01R 31/26* (2020.01)

(52) U.S. Cl.
CPC ................ *G01R 31/2621* (2013.01)

(58) Field of Classification Search
CPC ................ G01R 31/26; G01R 31/2608; G01R 31/2621; G01R 27/00; G01R 27/20; G01R 27/205
See application file for complete search history.

(56) References Cited

U.S. PATENT DOCUMENTS 7,847,288 B2    12/2010   Kwon
9,903,904 B2    2/2018   Sun et al.
(Continued)

FOREIGN PATENT DOCUMENTS

CN    101770965 A      7/2010
CN    103575998 A   *   2/2014
(Continued)

OTHER PUBLICATIONS

Contact resistance (Wikipedia).*
(Continued)

*Primary Examiner* — Son T Le
(74) *Attorney, Agent, or Firm* — Cooper Legal Group, LLC

(57) ABSTRACT

The present disclosure provides a measurement method for a contact resistance of a transistor test device and a computer-readable medium. The measurement method includes: providing multiple transistor test devices, where the transistor test devices each include a source, a drain, an active layer, a gate located at the active layer, and wires connected to the source and the drain, widths of gates, channel region lengths of active layers, and quantities of connected wires of the transistor test devices are the same, and widths of the active layers of the transistor test devices are different; obtaining multiple total resistances of the transistor test devices by measuring the transistor test devices; and determining contact resistances of the transistor test devices based on the multiple total resistances and the widths of the active layers matching the total resistances.

10 Claims, 4 Drawing Sheets

(56) References Cited

U.S. PATENT DOCUMENTS

| | | | |
|---|---|---|---|
| 2003/0122123 A1 | 7/2003 | Deng et al. | |
| 2003/0126567 A1* | 7/2003 | Amishiro | G01R 31/2621 |
| | | | 716/136 |
| 2004/0227191 A1 | 11/2004 | Honda | |
| 2010/0044699 A1* | 2/2010 | Chung | H01L 29/78618 |
| | | | 257/43 |
| 2017/0242065 A1 | 8/2017 | Guo et al. | |

FOREIGN PATENT DOCUMENTS

| | | |
|---|---|---|
| CN | 103575998 A | 2/2014 |
| CN | 104156526 A | 11/2014 |
| CN | 104808126 A | 7/2015 |
| CN | 105223420 A | 1/2016 |
| CN | 205749689 U | 11/2016 |
| CN | 107290594 A | 10/2017 |
| CN | 109637944 A | 4/2019 |
| JP | H06195426 A | 7/1994 |

OTHER PUBLICATIONS

International Search Report and Written Opinion cited in PCT/CN2021/106511 dated Oct. 12, 2021, 8 pages.
International Search Report and English Translation cited in PCT/CN2021/106550 dated Oct. 12, 2021, 11 pages.
Written Opinion and English Translation cited in PCT/CN2021/106550 dated Oct. 12, 2021, 7 pages.

* cited by examiner

MEASUREMENT METHOD FOR CONTACT RESISTANCE OF TRANSISTOR TEST DEVICE AND COMPUTER-READABLE MEDIUM

CROSS-REFERENCE TO RELATED APPLICATIONS

The present disclosure is a national stage entry of International Application No. PCT/CN2021/106550, filed on Jul. 15, 2021, which claims the priority to Chinese Patent Application No. 202011108324.9, titled "MEASUREMENT METHOD FOR CONTACT RESISTANCE OF TRANSISTOR TEST DEVICE AND COMPUTER-READABLE MEDIUM", filed on Oct. 16, 2020. The entire contents of International Application No. PCT/CN2021/106550 and Chinese Patent Application No. 202011108324.9 are incorporated herein by reference.

TECHNICAL FIELD

The present disclosure relates to, but is not limited to, a measurement method for a contact resistance of a transistor test device and a computer-readable medium.

BACKGROUND

In the field of dynamic random access memory (DRAM), the accuracy improvement of essential characteristics of a metal-oxide-semiconductor field-effect transistor (MOSFET) is mainly involved.

At present, outgoing wires cannot be removed during measurement of a MOSFET transistor. For example, during the design of a test component, a relatively large metal and a relatively large number of contacts are usually used to reduce a parasitic resistance effect.

However, in a DRAM, because an array and a peripheral MOSFET transistor coexist, a relatively large contact resistance is caused. This results in a relatively large parasitic resistance, affecting essential characteristics of the MOSFET transistor.

SUMMARY

An overview of the subject matter detailed in the present disclosure is provided below, which is not intended to limit the protection scope of the claims.

The present disclosure provides a measurement method for a contact resistance of a transistor test device and a computer-readable medium.

A first aspect of the present disclosure provides a measurement method for a contact resistance of a transistor test device. The transistor test device includes: a source, a drain, an active layer, a gate located at the active layer, and wires connected to the source and the drain. The measurement method includes:

providing multiple transistor test devices, where widths of the gates, channel region lengths of the active layers, and quantities of the connected wires of the transistor test devices are the same, and widths of the active layers of the transistor test devices are different;

obtaining multiple total resistances of the transistor test devices by measuring the transistor test devices; and determining contact resistances of the transistor test devices based on the multiple total resistances and the widths of the active layers matching the total resistances.

A second aspect of the present disclosure provides a computer-readable medium. The computer-readable medium stores a computer program; and when the program is executed by a processor, the measurement method according to the first aspect is implemented.

Other aspects of the present disclosure are understandable upon reading and understanding the accompanying drawings and detailed description.

BRIEF DESCRIPTION OF THE DRAWINGS

The accompanying drawings incorporated into the specification and constituting a part of the specification illustrate embodiments of the present disclosure, and are used to explain the principles of the embodiments of the present disclosure together with the description. In these accompanying drawings, similar reference numerals are used to represent similar elements. The accompanying drawings in the following description show merely some rather than all of the embodiments of the present disclosure. Persons skilled in the art may derive other accompanying drawings from these accompanying drawings without creative efforts.

DETAILED DESCRIPTION

The following clearly and completely describes the technical solutions in the embodiments of the present disclosure with reference to the accompanying drawings in the embodiments of the present disclosure. Apparently, the described embodiments are merely a part rather than all of the embodiments of the present disclosure. All other embodiments obtained by persons skilled in the art based on the embodiments in the present disclosure without creative efforts shall fall within the protection scope of the present disclosure. It should be noted that the embodiments in the present disclosure and features in the embodiments may be combined with each other in a non-conflicting manner.

Figure 1:
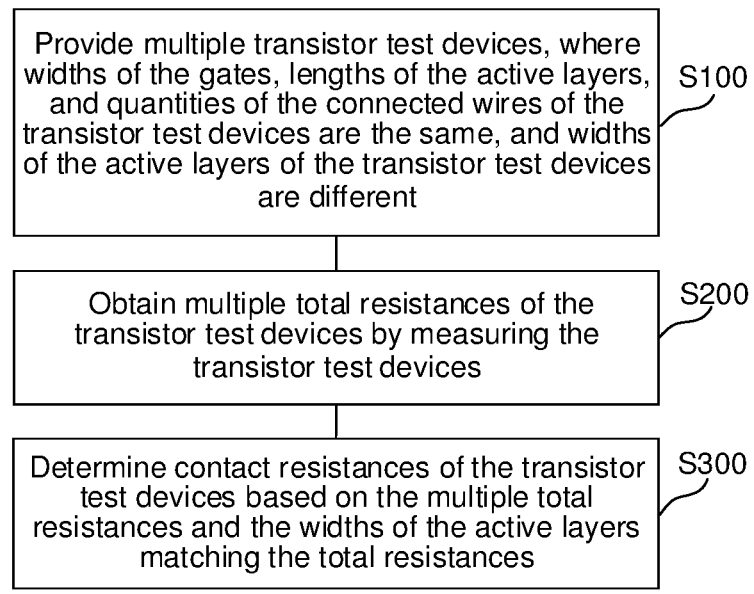
FIG. 1 is a flowchart of a measurement method according to an embodiment of the present disclosure.
Figure 2:
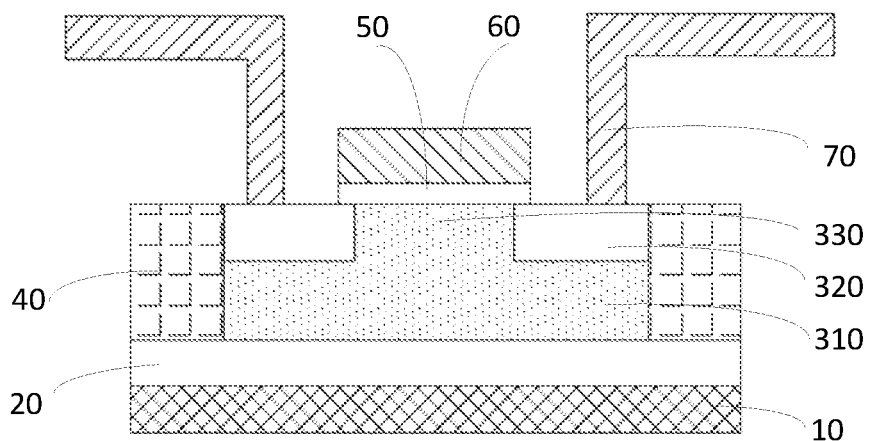
FIG. 2 is a cross-sectional view of a transistor test device according to an embodiment of the present disclosure.

An embodiment of the present disclosure provides a measurement method for a contact resistance of a transistor test device. As shown in FIG. 2, the transistor test device includes a source, a drain, an active layer, a gate located at the active layer, and wires connected to the source and the drain. As shown in FIG. 1, the measurement method includes the following steps.

Step S100. Provide multiple transistor test devices, where widths of gates, lengths of channel regions of active layers, and quantities of connected wires of the transistor test devices are the same, and widths of the active layers of the transistor test devices are different.

Step S200. Obtain multiple total resistances of the transistor test devices by measuring the transistor test devices.

Step S300. Determine contact resistances of the transistor test devices based on the multiple total resistances and the widths of the active layers matching the total resistances. According to the measurement method for a contact resistance of a transistor test device provided in the present disclosure, the multiple transistor test devices are fabricated on a same wafer, the widths of the gates, the channel region lengths of the active layers, the quantities of connected wires, and resistances of the wires of the transistor test devices are the same, and the widths of the active layers of the transistor test devices are different. The multiple total resistances of the transistor test devices are obtained by measuring the transistor test devices, and the contact resistances of the transistor test devices can be determined based on the multiple total resistances and the widths of the active layers matching the total resistances.

The following further describes each step of the measurement method for a contact resistance of a transistor test device in this exemplary embodiment.

In step S100, the multiple transistor test devices are provided, where the widths of the gates, the lengths of the channel regions of the active layers, and the quantities of connected wires of the transistor test devices are the same, and the widths of the active layers of the transistor test devices are different.

In this embodiment, as shown in FIG. 2, the transistor test device is provided. The transistor test device may be a MOSFET transistor. The following provides a description by using an N-type MOSFET transistor as an example. The MOSFET transistor includes a P-type doped substrate 10, a deep-N-well (DNW) 20, a P-well (P-Well) 310, an active layer 330, a source and drain 320 located on both sides of the active layer 330, shallow trench isolations (STIs) 40 located on both sides of the P-well 310, an insulating layer 50 located on one side of the active layer 330 away from the DNW 20, a gate 60 located on one side of the insulating layer 50 away from the active layer 330, and wires 70 located on two sides of the insulating layer 50 and connected to the source and drain 320.

Figure 3:
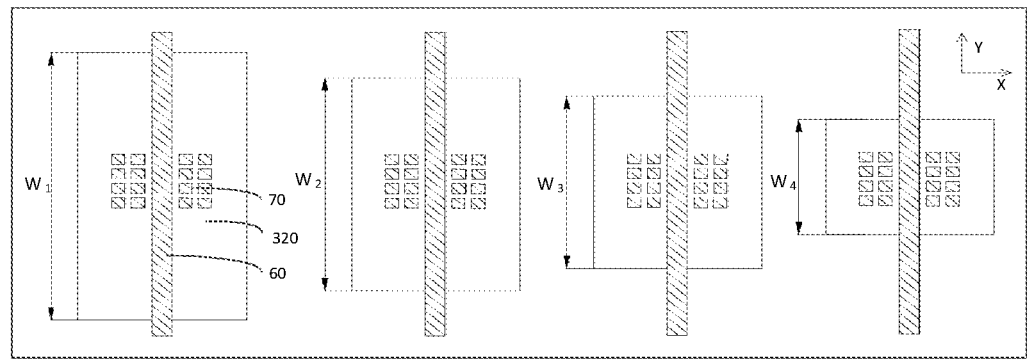
FIG. 3 is a schematic diagram of multiple transistor test devices according to an embodiment of the present disclosure.

In this embodiment, widths of gates 60, lengths of active layers (channels) 330, and quantities of wires 70 of the transistor test devices are the same, and widths of the active layers 330 of the transistor test devices are different. As shown in FIG. 3, a width of the active layer 330 is in a direction shown by a Y-axis, and a length of the active layer 330 is in a direction shown by an X-axis. A width of the gate 60 is in the direction shown by the Y-axis (that is, an extension direction of the gate), and the length of the gate 60 is in the direction shown by the X-axis. The gate 60 is located at the active layer 330, and orthographic projection of the gate 60 on the active layer 330 covers the active layer 330.

As shown in FIG. 3, there are an even number of wires 70 connected to the source and drain 320 on both sides of the gate 60; and on each side of the gate 60, wires 70 are distributed in two columns and four rows, or in other words, the wires 70 are evenly distributed on both sides of the gate 60. The wires 70 on each side of the gate 60 are connected in parallel to a same wire. To be specific, eight wires 70 on a left side of the gate 60 are connected in parallel to a same wire, and eight wires 70 on a right side of the gate 60 are connected in parallel to a same wire. A contact resistance $R_{Licon}$ of the transistor test device is a total resistance of eight wires connected in parallel, so that the contact resistance $R_{Licon}$ of the test device may be quite small. In this way, it can be ensured that the contact resistance $R_{Licon}$ has little impact on obtaining a channel resistance $R_{ch}$ of the transistor test device in a test process. In addition, resistance values of the wires on both sides of the gate 60 are the same. This can ensure contact resistances $R_{Licon}$ on both sides of the gate are the same, so that the contact resistances can be accurately determined, and the channel resistance of the transistor test device can be determined more accurately.

As shown in FIG. 3, four transistor test devices are formed on a same wafer, and may be located in one specified region of the same wafer, so that channel resistances and other parameters of the multiple transistor test devices may be closer to each other, so as to improve accuracy of contact resistances of the transistor test devices. In this way, resistance values of the contact resistances can be accurately determined, and resistance values of the channel resistances of the transistor test devices can be determined more accurately.

In step S200, the multiple total resistances of the transistor test devices are obtained by measuring the transistor test devices.

Figure 7:
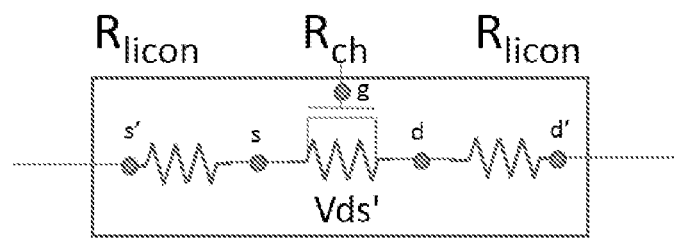
FIG. 7 is a schematic diagram of a total resistance of a transistor test device according to an embodiment of the present disclosure.

In this embodiment, as shown in FIG. 3, the width of the gate 60 is greater than the width of the active layer 330, the orthographic projection of the gate 60 on the active layer 330 covers the active layer 330. Therefore, FIG. 3 does not show the active layer 330. The width of the active layer 330 is changed to implement a change in the width of the active layer 330, so as to obtain the multiple total resistances of the transistor test devices. As shown in FIG. 7, the total resistance of the transistor test device $R_{total}$ is:

$$R_{total}=R_{ch}+2R_{Licon}$$

$R_{ch}$ is the channel resistance of the transistor test device, and $R_{Licon}$ is the contact resistance of the transistor test device.

The channel resistance $R_{ch}$ is:

$$R_{ch} = \frac{V_{ds}}{I_{ds}} = \frac{L}{\mu_{eff} C_{ox} W \left( V_g - V_{on} - \frac{mV_{ds}}{2} \right)}$$

$V_{ds}$ is a drain-source voltage, $I_{ds}$ is a drain-source current, L is a length of the active layer, W is a width of the active layer, $\mu_{eff}$ is effective mobility, $C_{ox}$ is a unit area capacitance of a gate oxide layer, $V_g$ is a gate voltage, $V_{on}$ is a starting voltage, and m is a body effect coefficient.

In this embodiment, a larger width of the active layer 330 leads to a smaller resistance of the active layer 330 (channel resistance $R_{ch}$). Because the total resistance $R_{total}$ of the transistor test device is a sum of the channel resistance $R_{ch}$ of the active layer and the contact resistance $R_{Licon}$ of the wires 70, and the contact resistance $R_{Licon}$ is a fixed value, a smaller channel resistance $R_{ch}$ leads to a smaller total resistance $R_{total}$ of the transistor test device, and the width of the active layer 330 is inversely proportional to the total resistance $R_{total}$ of the transistor test device. As shown in FIG. 7, it can be learned from a formula corresponding to a linear region of the MOSFET transistor that $R_{ch}$ is inversely proportional to W. Therefore, a graph is plotted between the measured total resistance $R_{total}$ and 1/W. A linear relationship of the graph is checked. Because $R_{total}=R_{ch}+2R_{Licon}$, a slope of the graph is related to $R_{ch}$ and an intercept is related to $R_{Licon}$.

Figure 4:
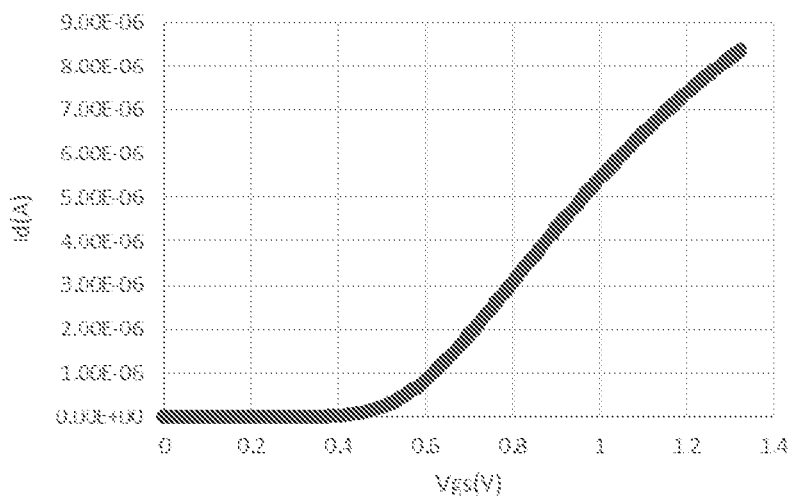
FIG. 4 is a curve graph of a relationship between a gate-source voltage and a drain current according to an embodiment of the present disclosure.
Figure 5:
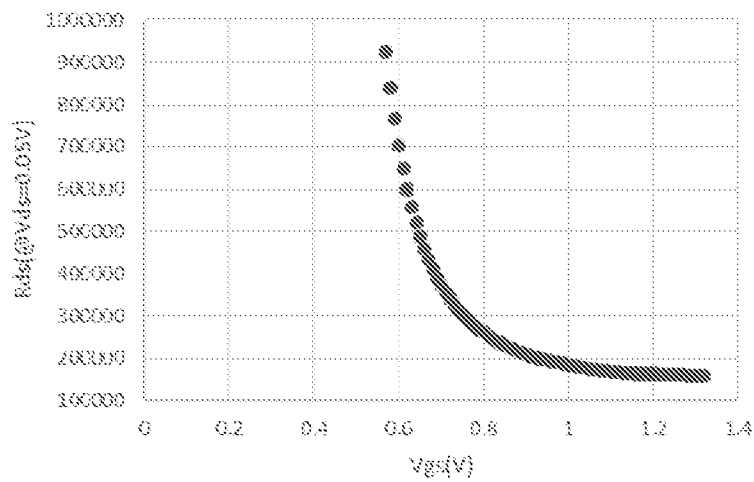
FIG. 5 is a curve graph of a relationship between a gate-source voltage and a drain-source resistance according to an embodiment of the present disclosure.
Figure 6:
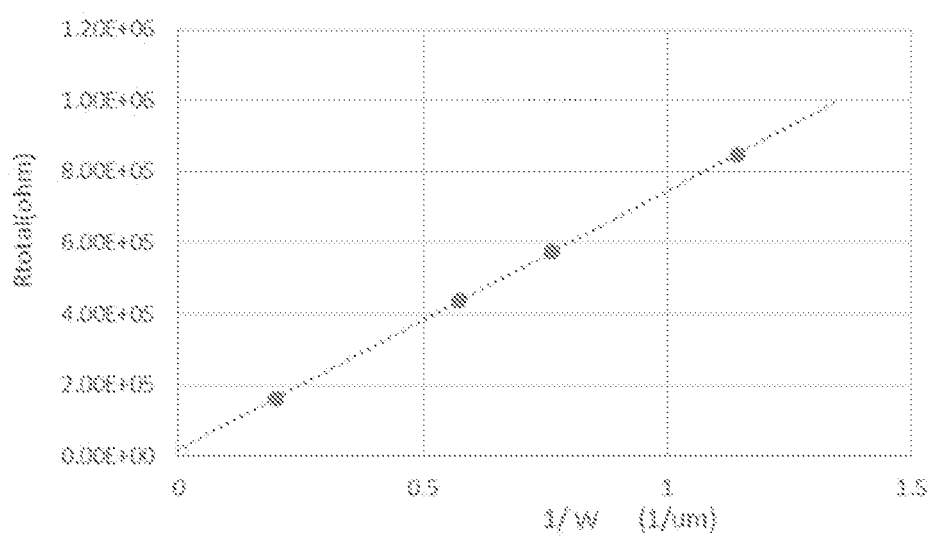
FIG. 6 is a bar chart of a relationship between a width of an active layer and a total resistance according to an embodiment of the present disclosure.

When the transistor test device is an N-type transistor, the drain-source voltage $V_{ds}$ is greater than the starting voltage $V_{on}$; and when the transistor test device is a P-type transistor, the drain-source voltage $V_{ds}$ is less than the starting voltage $V_{on}$ ($V_{th}$). In an embodiment of this example, as shown in FIG. 4 and FIG. 5, when $V_{gs}$ is greater than 0.5 V, $I_d$ is greater than 0; and when $V_{gs}$ is greater than 1.2 V, $R_{ds}$ tends to a stable value. Therefore, $V_{gs}$ is preferably greater than 1.2 V, so that resistance value of the contact resistance can be accurately determined, and resistance value of the channel resistance of the transistor test device can be determined more accurately.

In step S300, the contact resistances of the transistor test devices are determined based on the multiple total resistances and the widths of the active layers matching the total resistances.

In this embodiment, the gate voltage $V_g$ is greater than a preset value, $$V_g - V_{on} - \frac{mV_{ds}}{2} \approx V_g,$$

and the channel resistance $R_{ch}$ is:

$$R_{ch} \approx \frac{L}{\mu_{eff} C_{ox} W V_g}$$

Therefore, the contact resistance $R_{Licon}$ is:

$$R_{Licon} = \frac{R_{total1} W_1 - R_{total2} W_2}{2(W_1 - W_2)}$$

$R_{total1}$ is a total resistance measured when the width of the active layer is $W_1$, and $R_{total2}$ is a total resistance measured when the width of the active layer is $W_2$. The preset value of the gate voltage $V_g$ may be selected by a person skilled in the art according to an actual case, to ensure that the gate voltage $V_g$ is relatively large enough to satisfy $$V_g - V_{on} - \frac{mV_{ds}}{2} \approx V_g.$$

This is not limited in the present disclosure.

For example, four total resistances $R_{total}$ are calculated respectively by using four widths of the active layers, namely $W_1$, $W_2$, $W_3$, and $W_4$, the gate voltage $V_g$ can remain a constant value, to improve accuracy of calculated contact resistance $R_{Licon}$. Certainly, two, three, five or more pieces of data may be used to determine the contact resistance. This is not limited in the present disclosure. More different widths of the active layer are used for calculation, and more pieces of measurement data can be obtained, so as to further improve the accuracy of the calculated contact resistance $R_{Licon}$ and more accurately determine resistance value of the channel resistance of the transistor test device.

Figure 8:
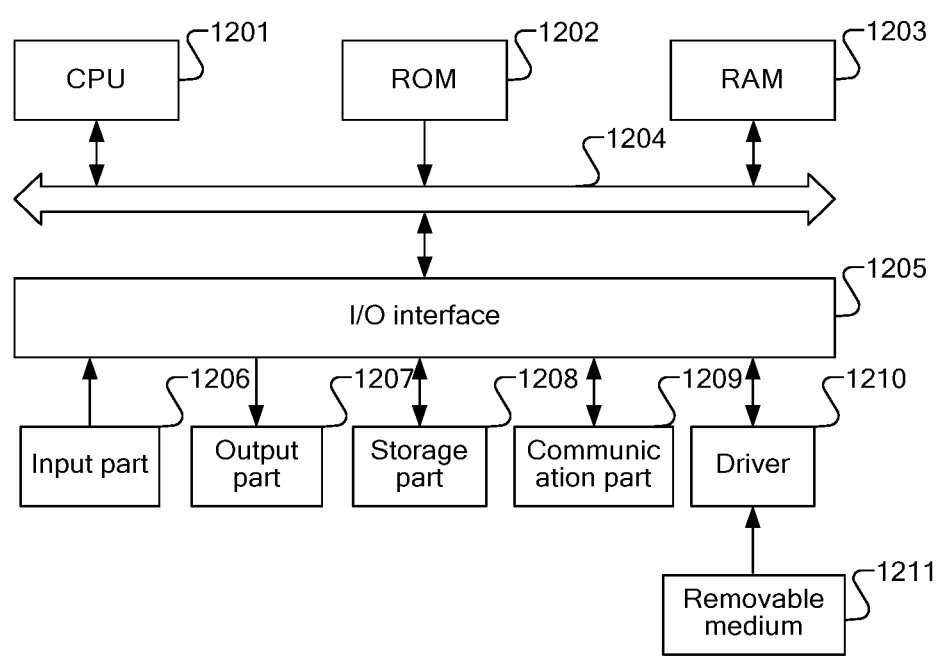
FIG. 8 is a schematic structural diagram of a computer system applicable to an electronic device configured to implement an embodiment of the present disclosure according to an embodiment of the present disclosure.

In the following, FIG. 8 is a schematic structural diagram of a computer system 1200 applicable to an electronic device configured to implement an embodiment of the present disclosure. The computer system 1200 of the electronic device shown in FIG. 8 is only an example, and should not constitute any limitation to a function and an application scope of the embodiments of the present disclosure.

As shown in FIG. 8, the computer system 1200 includes a central processing unit (CPU) 1201, and the CPU may conduct various appropriate operations and processing based on a program stored in a read-only memory (ROM) 1202 or a program loaded from a storage part 1208 into a random access memory (RAM) 1203. The RAM 1203 further stores various programs and data required for system operations. The CPU 1201, the ROM 1202, and the RAM 1203 are connected to each other through a bus 1204. An input/output (I/O) interface 1205 is also connected to the bus 1204.

The following components are connected to the I/O interface 1205: an input part 1206 including a keyboard, a mouse, and the like; an output part 1207 including a cathode ray tube (CRT), a liquid crystal display (LCD), a speaker, and the like; a storage part 1208 including a hard disk and the like; and a communication part 1209 including a LAN card and a network interface card of a modem and the like. The communication part 1209 conducts communication processing via a network such as the Internet. A driver 1210 is also connected to the I/O interface 1205 as needed. A removable medium 1211, such as a magnetic disk, an optical disk, a magneto-optical disk, or a semiconductor memory, is installed on the driver 1210 as needed, so that a computer program read from the removable medium 1211 is installed into the storage part 1208 as needed.

Particularly, according to an embodiment of the present disclosure, the process described above with reference to the flowchart can be implemented as a computer software program. For example, an embodiment of the present disclosure includes a computer program product. The computer program product includes a computer program carried on a computer-readable medium, and the computer program contains program code for implementing the method shown in the flowchart. In such an embodiment, the computer program may be downloaded from a network through the communication part 1209 and installed, and/or obtained from the removable medium 1211 and installed. When the computer program is executed by the central processing unit (CPU) 1201, the above-mentioned functions defined in the system in the present disclosure are executed.

It should be noted that the computer-readable medium described in the present disclosure may be a computer readable signal medium, a computer readable storage medium, or any combination thereof. The computer readable storage medium may be, for example, but is not limited to, an electrical, magnetic, optical, electromagnetic, infrared, or semiconductor system, apparatus, or device, or any combination of the above. More specific examples of the computer readable storage medium may include, but are not limited to: an electric connector with one or more wires, a portable computer magnetic disk, a hard drive, a random access memory (RAM), a read-only memory (ROM), an erasable programmable read-only memory (EPROM or flash drive), an optical fiber, a compact disk read-only memory (CD-ROM), an optical storage device, a magnetic storage device, or any proper combination of the above. In the present disclosure, the computer readable storage medium may be any tangible medium that includes or stores a program, and the program may be used by or used in combination with an instruction execution system, apparatus, or device. In the present disclosure, the computer readable signal medium may include a data signal propagated in a baseband or propagated as a part of a carrier, and carries computer readable program code. Such a propagated data signal may be in multiple forms, including, but not limited to an electromagnetic signal, an optical signal, or any proper combination of the above. The computer readable signal medium may alternatively be any computer-readable medium except the computer readable storage medium. The computer-readable medium may send, propagate, or transmit a program used by or used in combination with an instruction execution system, apparatus, or device. The program code contained in the computer-readable medium may be transmitted by using any suitable medium, including, but is not limited to radio, an electric wire, an optical fiber, RF, and the like, or any proper combination of the above.

The flowcharts and block diagrams in the accompanying drawings illustrate system architectures, functions, and operations that may be implemented by the system, method, and computer program product in various embodiments of the present disclosure. Herein, each block in the flowcharts or block diagrams may represent a module, a program segment, or a part of code, and the module, the program segment, or the part of the code includes one or more executable instructions used to implement specified logical functions. It should also be noted that, in some alternative implementations, functions indicated in the blocks may alternatively be implemented in an order different from the order indicated in the accompanying drawings. For example, two blocks represented contiguously can actually be executed in parallel basically, or sometimes can be executed in the reverse order, depending on the functions involved. It should also be noted that each block in the block diagrams or flowcharts and combinations of the blocks in the block diagrams or the blocks in the flowcharts may be implemented by a dedicated hardware-based system for executing specified functions or operations, or may be implemented by a combination of dedicated hardware and computer instructions.

Units described in the embodiments of the present disclosure can be implemented by software or hardware, and the described units may alternatively be disposed in a processor. Names of these units do not constitute any limitation on the units in some cases.

In addition, the present disclosure provides a computer-readable medium. The computer-readable medium may be included in the electronic device described in the foregoing embodiments; or it may exist alone without being assembled into the electronic device. The computer-readable medium carries one or more programs. When the one or more programs are executed by an electronic device, the electronic device is enabled to implement the detection method in the foregoing embodiment.

For example, the electronic device can implement the following steps in FIG. 1: Step S100. Provide multiple transistor test devices, where widths of gates, lengths of channel regions of active layers, and quantities of connected wires of the transistor test devices are the same, and widths of the active layers of the transistor test devices are different. Step S200. Obtain multiple total resistances of the transistor test devices by measuring the transistor test devices. Step S300. Determine contact resistances of the transistor test devices based on the multiple total resistances and the widths of the active layers matching the total resistances.

It should be noted that although several modules or units of a device for action execution are mentioned in the above detailed description, such division is not mandatory. Actually, according to the implementations of the present disclosure, features and functions of two or more modules or units described above can be embodied in one module or unit. On the contrary, features and functions of a module or unit described above can be further divided into multiple modules or units to be embodied.

Through the description of the above implementations, persons skilled in the art can easily understand that the example embodiments described herein can be implemented by software, or can be implemented by combining software with necessary hardware. Therefore, the technical solution according to the implementations of the present disclosure can be embodied in a form of a software product. The software product may be stored in a non-volatile storage medium (which may be a CD-ROM, a USB flash drive, a removable hard disk, or the like) or on a network, and include several instructions to enable a computing device (which may be a personal computer, a server, a touch terminal, a network device, or the like) to implement the method according to the implementations of the present disclosure.

Each embodiment or implementation in the specification is described in a progressive manner. Each embodiment focuses on the difference from other embodiments, and for the same and similar parts between the embodiments, mutual reference may be made.

In the descriptions of this specification, a description with reference to the term "embodiment", "exemplary embodiment", "some implementations", "an exemplary implementation", "an example", and the like means that a specific feature, structure, material, or characteristic described in combination with the implementation(s) or example(s) is included in at least one implementation or example of the present disclosure.

In this specification, the schematic expression of the above terms does not necessarily refer to the same implementation or example. Moreover, the described specific feature, structure, material or characteristic may be combined in an appropriate manner in any one or more implementations or examples.

It should be understood that, in the descriptions of the present disclosure, orientations or position relationships indicated by terms such as "center", "upper", "lower", "left", "right", "vertical", "horizontal", "inside", and "outside" are orientations or position relationships based on illustrations in the accompanying drawings. The terms are merely intended to facilitate and simplify the descriptions of this application, but are not intended to indicate or imply that an indicated apparatus or element needs to have a particular orientation and needs to be constructed and operated in a particular orientation, and therefore cannot be construed as a limitation on the present disclosure.

It can be understood that the terms "first", "second", and the like used in the present disclosure can be used to describe various structures in the present disclosure, but these structures are not limited by these terms. These terms are only used to distinguish a first structure from another structure.

In one or more drawings, same components are represented by similar reference numerals. For clarity, various parts in the accompanying drawings are not drawn to scale. In addition, some well-known parts may not be shown. For brevity, a structure obtained after several steps may be described in one figure. In the following, many specific details in the present disclosure are described, for example, a structure, a material, and a dimension of a device, and a processing process and a technology for the device, to understand the present disclosure more clearly. However, as persons skilled in the art can understand, the present disclosure may not be implemented according to these specific details.

Finally, it should be noted that the above embodiments are merely intended to describe the technical solutions of the present disclosure, rather than to limit the present disclosure. Although the present disclosure is described in detail with reference to the above embodiments, persons skilled in the art should understand that they may still make modifications to the technical solutions described in the above embodiments or make equivalent replacements to some or all technical features thereof, and these modifications or replacements do not make the essences of the corresponding technical solutions depart from the scope of the technical solutions in the embodiments of the present disclosure.

INDUSTRIAL APPLICABILITY

According to the measurement method for a contact resistance of a transistor test device and the computer-readable medium provided in the embodiments of the present disclosure, multiple transistor test devices are fabricated on a same wafer, widths of gates, channel region lengths of active layers, quantities of connected wires, and resistances of the wires of the transistor test devices are the same, and widths of the active layers of the transistor test devices are different. Multiple total resistances of the transistor test devices are obtained by measuring the transistor test devices, and contact resistances of the transistor test devices can be determined based on the multiple total resistances and the widths of the active layers matching the total resistances.

The invention claimed is:

1. A measurement method for contact resistances of transistor test devices, wherein each of the transistor test devices comprises a source, a drain, an active layer, a gate located at the active layer, and wires connected to the source and the drain; and the measurement method comprises:
providing multiple of the transistor test devices, wherein widths of the gates, lengths of the active layers, and quantities of the connected wires are the same for the transistor test devices, and widths of the active layers are different for the transistor test devices;
obtaining a total resistance of each of the transistor test devices by measuring the transistor test devices to obtain multiple total resistances; and
determining a contact resistance of each of the transistor test devices based on the multiple total resistances and the widths of the active layers of the transistor test devices, wherein the contact resistance $R_{Licon}$ is:

$$R_{Licon} = \frac{R_{total1}W_1 - R_{total2}W_2}{2(W_1 - W_2)},$$

wherein $R_{total1}$ is a total resistance measured when the width of the active layer is $W_1$, and $R_{total2}$ is a total resistance measured when the width of the active layer is $W_2$.

2. The measurement method according to claim 1, wherein orthographic projection of the gate on the active layer covers the active layer.

3. The measurement method according to claim 1, wherein the transistor test devices are formed on a same wafer.

4. The measurement method according to claim 1, wherein resistances of the wires are the same.

5. The measurement method according to claim 1, wherein multiple wires located on a same side of the gate are connected in parallel.

6. The measurement method according to claim 1, wherein there are an even number of the wires, and the wires are evenly distributed on both sides of the gate.

7. The measurement method according to claim 6, wherein the total resistance $R_{total}$ is:

$$R_{total}=R_{ch}+2R_{Licon}, \text{ wherein}$$

$R_{ch}$ is a channel resistance of the transistor test device, and $R_{Licon}$ is the contact resistance.

8. The measurement method according to claim 7, wherein the channel resistance $R_{ch}$ is:

$$R_{ch} = \frac{V_{ds}}{I_{ds}} = \frac{L}{\mu_{eff} C_{ox} W \left(V_g - V_{on} - \frac{mV_{ds}}{2}\right)},$$

wherein
$V_{ds}$ is a drain-source voltage, $I_{ds}$ is a drain-source current, L is a length of the active layer, W is a width of the active layer, $\mu_{eff}$ is effective mobility, $C_{ox}$ is a unit area capacitance of a gate oxide layer, $V_g$ is a gate voltage, $V_{on}$ is a starting voltage, and m is a body effect coefficient.

9. The measurement method according to claim 8, wherein the gate voltage $V_g$ is greater than a preset value, and the channel resistance $R_{ch}$ is:

$$R_{ch} \approx \frac{L}{\mu_{eff} C_{ox} W V_g}.$$

10. A non-transitory computer-readable medium, wherein the non-transitory computer-readable medium stores a computer program; and when the program is executed by a processor, the measurement method according to claim 1 is implemented.

* * * * *